United States Patent
Brückner et al.

(10) Patent No.: US 11,837,844 B2
(45) Date of Patent: Dec. 5, 2023

(54) METHOD FOR MANUFACTURING OPTOELECTRIC SEMICONDUCTOR COMPONENT AND OPTOELECTRIC SEMICONDUCTOR COMPONENT DEVICE

(71) Applicant: OSRAM OLED GmbH, Regensburg (DE)

(72) Inventors: John Brückner, Regensburg (DE); Urs Heine, Regensburg (DE); Sven Gerhard, Alteglofsheim (DE); Lars Nähle, Bad Abbach (DE); Andreas Löffler, Neutraubling (DE); André Somers, Obertraubling (DE)

(73) Assignee: OSRAM OLED GMBH, Regensburg (DE)

( * ) Notice: Subject to any disclaimer, the term of this patent is extended or adjusted under 35 U.S.C. 154(b) by 552 days.

(21) Appl. No.: 16/961,901

(22) PCT Filed: Dec. 27, 2018

(86) PCT No.: PCT/EP2018/097046
§ 371 (c)(1),
(2) Date: Jul. 13, 2020

(87) PCT Pub. No.: WO2019/137816
PCT Pub. Date: Jul. 18, 2019

(65) Prior Publication Data
US 2020/0388985 A1   Dec. 10, 2020

(30) Foreign Application Priority Data
Jan. 15, 2018 (DE) .......................... 102018100763.9

(51) Int. Cl.
*H01S 5/02*  (2006.01)
*H01L 21/304*  (2006.01)
*H01L 21/302*  (2006.01)

(52) U.S. Cl.
CPC .......... *H01S 5/0203* (2013.01); *H01S 5/0206* (2013.01); *H01L 21/302* (2013.01); *H01L 21/304* (2013.01)

(58) Field of Classification Search
CPC .... H01S 5/0202; H01S 5/0203; H01S 5/0201; B28D 5/0005; B28D 5/0011;
(Continued)

(56) References Cited

U.S. PATENT DOCUMENTS 5,621,746 A * 4/1997 Futatsugi .............. H01S 5/0207
438/33
5,629,233 A    5/1997 Chand et al.
(Continued)

FOREIGN PATENT DOCUMENTS

CN   102637639 A    8/2012
EP   0341034 A2    11/1989
(Continued)

OTHER PUBLICATIONS

International Search Report and Written Opinion in corresponding International Application No. PCT/EP2018/097046 dated Apr. 25, 2019, 17 pages.
Japanese Notice of Reasons for Rejection in Japanese Application No. 2020-537009 dated Aug. 29, 2022, 19 pages.

*Primary Examiner* — Xinning(Tom) Niu
*Assistant Examiner* — Delma R Fordé
(74) *Attorney, Agent, or Firm* — MH2 TECHNOLOGY LAW GROUP LLP

(57) ABSTRACT

A method for singulating semiconductor components (20) is specified, said method comprising the steps of providing a carrier (21), applying at least two semiconductor chips (22) on the carrier (21), etching at least one break nucleus (23) at a side of the carrier (21) facing the semiconductor chips (22), and singulating at least two semiconductor components (20) by breaking the carrier (21) along the at least one break
(Continued)

nucleus (23). The at least one break nucleus (23) extends at least in places in a vertical direction (z), the vertical direction (z) being perpendicular to a main extension plane of the carrier (21), and the at least one break nucleus (23) is arranged between the two semiconductor chips (22) in a lateral direction (x), the lateral direction (x) being parallel to the main extension plane of the carrier (21). Further, each of the semiconductor components (20) comprises at least one of the semiconductor chips (22), and the expansion of the at least one break nucleus (23) in the vertical direction (z) is at least 1% of the expansion of the carrier (21) in the vertical direction (z). Furthermore, a semiconductor component (20) is specified.

20 Claims, 6 Drawing Sheets

(58) Field of Classification Search
CPC ... H01L 33/0095; H01L 21/78; H01L 21/304; H01L 41/338; H01L 21/302; H01L 21/3043; H01L 21/306
See application file for complete search history.

(56) References Cited

U.S. PATENT DOCUMENTS

| | | | |
|---|---|---|---|
| 5,780,320 | A | 7/1998 | Kinoshita |
| 6,156,584 | A * | 12/2000 | Itoh ................. H01S 5/0201 |
| | | | 438/33 |
| 6,214,703 | B1 | 4/2001 | Chen et al. |
| 7,041,523 | B2 | 5/2006 | Kawakami et al. |
| 7,049,672 | B2 | 5/2006 | Headley et al. |
| 2002/0164874 | A1 | 11/2002 | Wanibe et al. |
| 2012/0322242 | A1 | 12/2012 | Lei et al. |
| 2013/0148681 | A1* | 6/2013 | Hamaguchi ........ H01S 5/3013 |
| | | | 438/33 |
| 2013/0230068 | A1 | 9/2013 | Lell et al. |
| 2015/0243558 | A1 | 8/2015 | Anselm et al. |
| 2020/0388988 | A1* | 12/2020 | Enzmann ............ H01S 5/0233 |

FOREIGN PATENT DOCUMENTS

| | | |
|---|---|---|
| JP | H8116137 A2 | 5/1996 |
| JP | 200317791 A | 1/2003 |
| JP | 2011243857 A | 12/2011 |
| JP | 2013120891 A2 | 6/2013 |
| JP | 2016127176 A2 | 7/2016 |

* cited by examiner

METHOD FOR MANUFACTURING OPTOELECTRIC SEMICONDUCTOR COMPONENT AND OPTOELECTRIC SEMICONDUCTOR COMPONENT DEVICE

CROSS-REFERENCE TO RELATED APPLICATIONS

This patent application is a national stage entry from International Application No. PCT/EP2018/097046, filed on Dec. 27, 2018, published as International Publication No. WO 2019/137816 A1 on Jul. 18, 2019, and claims priority under 35 U.S.C. § 119 from German patent application 10 2018 100 763.9, filed Jan. 15, 2018, the entire contents of all of which are incorporated herein by reference.

A method for singulating semiconductor components and a semiconductor component are specified.

It is an object of the present disclosure to specify a method for singulating semiconductor components which can be operated efficiently. Another object is to specify a semiconductor component that can be operated efficiently.

According to at least one embodiment of the method for singulating semiconductor components, the method comprises a method step in which a carrier is provided. The carrier can be, for example, a connection board, a circuit board, a printed circuit board or a wafer. The carrier can be a three-dimensional body and can have the shape of a cylinder, a disc or a cuboid, for example. The carrier may have a main extension plane. For example, the main extension plane of the carrier may be parallel to a surface, such as a top surface, of the carrier. The carrier may comprise a semiconductor material. For example, the carrier may be formed with silicon, onto and/or into which electrically conductive structures such as conductor paths and/or contact points are applied and/or inserted.

According to at least one embodiment of the method for singulating semiconductor components, the method comprises a method step in which at least two semiconductor chips are applied on the carrier. It is also possible that a plurality of semiconductor chips are applied on the carrier. The semiconductor chips can be optoelectronic semiconductor chips. The semiconductor chips can be designed to emit electromagnetic radiation, especially light, during operation. The semiconductor chips are, for example, luminescent diode chips such as light-emitting diode chips or laser diode chips. The at least two semiconductor chips can be applied directly or indirectly on the carrier at a top side of the carrier and fixed there. In particular, the semiconductor chips can be fixed to the carrier by soldering or sintering or grown onto the carrier and structured by means of epitaxy. If the semiconductor chips are indirectly applied to the top side of the carrier, there may be at least one additional component between the carrier and the semiconductor chips. The semiconductor chips have a top side facing away from the carrier.

Each of the semiconductor chips can have a p-doped region, an active region and an n-doped region. The active region can be designed to emit electromagnetic radiation during operation of the semiconductor component. The active region can be arranged between the p-doped region and the n-doped region. The active region can be arranged on the p-doped region on the side facing away from the carrier. The n-doped region can be arranged on the active region.

According to at least one embodiment of the method for singulating semiconductor components, the method comprises a method step in which at least one break nucleus is etched at a side of the carrier facing the semiconductor chips. The break nucleus can be etched, for example, at the top side of the carrier or the semiconductor chips. This means that the break nucleus is etched at the side of the carrier where the semiconductor chips are arranged. If the semiconductor chips cover the top side of the carrier completely, the break nucleus can be etched from the top side of the semiconductor chips, through at least one semiconductor chip, in the direction of the carrier. If the semiconductor chips do not cover the top side of the carrier completely, the break nucleus can be etched at least in places at the top side of the carrier in the direction of a side facing away from the top side of the carrier. To form the break nucleus, material of the carrier or the semiconductor chips can be removed by etching. The break nucleus can thus be a trench-like structure or a recess. The break nucleus may have side walls which are transverse or perpendicular to the main extension plane of the carrier.

The shape of the break nucleus can be created by photo technology, for example. For this purpose a mask can be applied to the carrier or to the carrier with the semiconductor chips. The shape of the break nucleus can be defined by the mask. The shape of the break nucleus can be defined in a plane parallel to the main extension plane of the carrier.

According to at least one embodiment of the method for singulating semiconductor components, the method comprises a method step in which at least two semiconductor components are singulated by breaking the carrier along the at least one break nucleus. The carrier can be broken along a direction which is transverse to the main extension plane of the carrier. It is also possible that the carrier is broken along a vertical direction, the vertical direction being perpendicular to the main extension plane of the carrier. That the carrier is singulated along the at least one break nucleus may mean that a separation plane along which the carrier is singulated runs through the break nucleus. The separation plane can run from the top side of the carrier to the bottom side of the carrier facing away from the top side and through the break nucleus. For example, the separation plane can run along a main extension direction of the break nucleus.

The break nucleus can be used to determine the position at which the carrier is singulated. It is also possible that by shaping the break nucleus, the singulation of the carrier at the position of the break nucleus is simplified compared to other positions. By etching the break nucleus, it is thus possible to determine the separation plane along which the semiconductor components can be singulated.

According to at least one embodiment of the method for singulating semiconductor components, the at least one break nucleus extends at least in places in a vertical direction, the vertical direction being perpendicular to a main extension plane of the carrier. The break nucleus can, for example, be etched in a vertical direction from the top side of the carrier or the semiconductor chips. Thus, the break nucleus can have an expansion in the vertical direction. In addition, the break nucleus may have an expansion in directions other than the vertical direction.

According to at least one embodiment of the method for singulating semiconductor components, the at least one break nucleus is arranged between the two semiconductor chips in a lateral direction, the lateral direction being parallel to the main extension plane of the carrier. This means, for example, that the break nucleus is arranged at the top side of the carrier between the two semiconductor chips. The break nucleus can be arranged at a distance from the semiconductor chips. It is also possible that the break nucleus is arranged at the top side of the semiconductor chips between the two semiconductor chips.

A plurality of semiconductor chips can be arranged on the carrier and a plurality of break nuclei can be etched. The break nucleus can in each case extend along the surface in a first lateral direction. In a second lateral direction, which is perpendicular to the first lateral direction, a break nucleus can be arranged between two semiconductor chips.

According to at least one embodiment of the method for singulating semiconductor components, each of the semiconductor components comprises at least one of the semiconductor chips. By breaking the carrier along the break nucleus, individual semiconductor components can be produced. Each of the semiconductor components may be characterized by comprising at least one semiconductor chip and part of the carrier. Preferably, the semiconductor components have approximately the same size.

The semiconductor components may have break edges, which result from singulating the semiconductor components. The break edges may be transverse or perpendicular to the main extension plane of the carrier. Different regions of the semiconductor chips can be exposed at the break edges. For example, the n-doped region and the p-doped region of each semiconductor chip may extend to at least one break edge of the respective semiconductor component. Thus, the p-doped region and the n-doped region of the respective semiconductor chip can be exposed at at least one break edge.

According to at least one embodiment of the method for singulating semiconductor components, the expansion of the at least one break nucleus in the vertical direction is at least 1% of the expansion of the carrier in the vertical direction. The expansion of the break nucleus in the vertical direction is predetermined, for example, by the depth of the etched trench-like structure. The expansion of the carrier in the vertical direction is predetermined by the thickness of the carrier in the vertical direction, for example. The expansion of the break nucleus in the vertical direction can be at most 100% of the expansion of the carrier with the semiconductor chips in the vertical direction.

The method for singulating semiconductor components described here is based, inter alia, on the idea that by introducing the break nucleus, the singulation of the semiconductor components is simplified. The break nucleus or nuclei can define the position or a direction along which the semiconductor components are singulated. The break nucleus or nuclei thus define the position at which the semiconductor components are singulated. Thus, the semiconductor components can have a predefinable size.

Furthermore, the method for singulating semiconductor components is simplified, since no chemical cleaning and no removal of material residues is required after etching the break nuclei. Since the break nucleus or break nuclei are produced by etching, no or only few material residues remain in the area of the side walls of the break nuclei. This means that even in the area of the break edges of the semiconductor components, no or only few material residues remain. It is advantageous to avoid material residues in the area of the break edges of the semiconductor components, as these can lead to short circuits or leakage currents within the semiconductor component. If, for example, the p-doped region and the n-doped region are exposed at the break edges of the semiconductor components, it is advantageous to avoid material residues, as these can cause leakage currents or short circuits in the area of the break edges during operation of the semiconductor components.

Furthermore, the method described here allows for efficient singulation of semiconductor components. The break nuclei can already be etched when the semiconductor chips are still present in a composite on the carrier. Subsequently, a plurality of semiconductor components can be singulated simultaneously along the break nuclei.

In addition, the method described here can be used to produce a semiconductor component which can be operated efficiently. The active region of the semiconductor chip can be arranged on the side of the p-doped region facing away from the carrier, and the n-doped region can be arranged on the active region. Due to the avoidance of material residues, leakage currents and short circuits in the semiconductor component are avoided for this design. Furthermore, this design allows for improved heat dissipation, for example via a solder material arranged between the p-doped region and the carrier. Thus, component stability and lifetime can be improved and the semiconductor component can be operated at high power levels.

According to at least one embodiment of the method for singulating semiconductor components, the method comprises method steps in which a carrier is provided, at least two semiconductor chips are applied on the carrier, at least one break nucleus is etched at a side of the carrier facing the semiconductor chips, and at least two semiconductor components are singulated by breaking the carrier along the at least one break nucleus, wherein the at least one break nucleus extends at least in places in a vertical direction, the vertical direction being perpendicular to a main extension plane of the carrier, the at least one break nucleus is arranged between the two semiconductor chips in a lateral direction, the lateral direction being parallel to the main extension plane of the carrier, each of the semiconductor components comprises at least one of the semiconductor chips, and the expansion of the at least one break nucleus in the vertical direction is at least 1% of the expansion of the carrier in the vertical direction.

Furthermore, a semiconductor component is specified. The semiconductor component can preferably be produced using a method described here. In other words, all features disclosed for the method for singulating semiconductor components are also disclosed for the semiconductor component and vice versa.

According to at least one embodiment of the semiconductor component, the semiconductor component comprises a component carrier. The component carrier may be a part of a carrier. The carrier can be, for example, a connection board, a circuit board, a printed circuit board or a wafer. The component carrier can be formed by singulating the semiconductor component. A carrier can be singulated into a plurality of component carriers, each semiconductor component comprising one component carrier. The component carrier has a main extension plane.

According to at least one embodiment of the semiconductor component, the semiconductor component comprises a semiconductor chip which is arranged on the component carrier.

According to at least one embodiment of the semiconductor component, the component carrier has break edges which are transverse to a main extension plane of the component carrier. The break edges may include the side surfaces of the component carrier which are transverse or perpendicular to the main extension plane of the component carrier. The break edges can additionally include the side surfaces of the semiconductor chip which are transverse or perpendicular to the main extension plane of the component carrier. The break edges can be created by singulating the semiconductor component along the break edges. It is also possible that the break edges are perpendicular to the main extension plane of the component carrier. The break edges of the component carrier may be any outer surfaces of the component carrier which are perpendicular to the main extension plane of the component carrier. The break edges can extend further along all outer surfaces of the semiconductor chip which are perpendicular to the main extension plane of the component carrier. The break edges may show traces of the singulation process at least in places.

According to at least one embodiment of the semiconductor component, at least one of the break edges has a notch at least in places, so that a lateral expansion of the semiconductor component in a lateral direction on a top side of the semiconductor component facing away from the component carrier is smaller at least in places than a lateral expansion of the semiconductor component in the lateral direction in the area of the component carrier, the lateral direction being parallel to the main extension plane of the component carrier. For example, the notch can be an area where material of the component carrier or semiconductor chip has been removed. The notch can be a recess, for example. The notch can be arranged on one side of the semiconductor component. It is also possible that the notch is arranged on several sides of the semiconductor component or that the semiconductor component has several notches.

In the area of the notch, the lateral expansion of the semiconductor component in a lateral direction on the top side of the semiconductor component is smaller than the lateral expansion of the semiconductor component in the area of the component carrier where the notch is not arranged. This means that the lateral expansion of the semiconductor component in a lateral direction is reduced at least in places due to the notch.

According to at least one embodiment of the semiconductor component, the break edge shows traces of an etching process in the area of the notch. The break edge may show traces of an etching process in the entire area of the notch. The notch can be formed by an etching process. This is an objective feature that can be detected on the finished semiconductor component, for example by microscopic examination.

According to at least one embodiment of the semiconductor component, the expansion of the notch in the vertical direction is at least 1% of the expansion of the component carrier in the vertical direction, the vertical direction being perpendicular to the main extension plane of the component carrier. The notch thus extends over at least part of the vertical expansion of the semiconductor component. This means that the lateral expansion of the semiconductor component in a lateral direction is reduced at the vertical positions where the notch is arranged. At the vertical positions where the notch is not arranged, the lateral expansion of the semiconductor component in the lateral direction is not reduced.

The semiconductor component described here is based, inter alia, on the idea that leakage currents and short circuits in the semiconductor component are avoided. The notch shows traces of an etching process and can be formed by an etching process. This means that no or only few material residues remain at the break edge. Since the p-doped region and the n-doped region of the semiconductor chip can be exposed in the area of the break edge or in the area of the notch, material residues in this area can lead to leakage currents or short circuits. Thus, by avoiding material residues in these areas, leakage currents and short circuits in the semiconductor component are avoided and the semiconductor component can be operated more efficiently.

Between the p-doped region of the semiconductor chip and the component carrier a material can be arranged, for example a solder material, through which heat generated in the semiconductor chip during operation can be dissipated. Therefore, the semiconductor component can be operated advantageously at high power levels and the component stability and lifetime are increased.

According to at least one embodiment of the semiconductor component, the semiconductor component comprises a component carrier and a semiconductor chip which is arranged on the component carrier, wherein the component carrier has break edges which extend transversely to a main extension plane of the component carrier, at least one of the break edges has a notch at least in places, so that a lateral expansion of the semiconductor component in a lateral direction on a top side of the semiconductor component facing away from the component carrier is smaller at least in places than a lateral expansion of the semiconductor component in the lateral direction in the area of the component carrier, the lateral direction being parallel to the main extension plane of the component carrier, the break edge shows traces of an etching process in the area of the notch, and the expansion of the notch in the vertical direction is at least 1% of the expansion of the component carrier in the vertical direction, the vertical direction being perpendicular to the main extension plane of the component carrier.

The following embodiments can refer to both the method described here and the semiconductor component described here.

According to at least one embodiment of the method or the semiconductor component, the expansion of the at least one break nucleus or notch in the vertical direction is at least 5% and at most 40% of the expansion of the carrier or component carrier in the vertical direction. For this range of the expansion of the break nucleus in the vertical direction, singulation of the semiconductor components along the break nucleus is simplified. For these values, the break can be guided along the break nucleus to singulate the semiconductor components. Thus the size of the semiconductor components can be determined by the arrangement of the break nuclei. The semiconductor component advantageously has the notch with an expansion in the vertical direction of at least 5% and at most 40%, since the semiconductor component thus has a predefinable size and can be singulated in a simplified manner.

According to at least one embodiment of the method or the semiconductor component, the break nucleus is generated by plasma etching. A mask can be used to define the shape of the break nucleus. When the break nucleus is generated by plasma etching, advantageously no or only few material residues remain in the area of the break nucleus.

According to at least one embodiment of the method or the semiconductor component, the semiconductor components are semiconductor lasers. For example, the semiconductor component may be a ridge waveguide laser.

According to at least one embodiment of the method or the semiconductor component, the expansion of the break nucleus or notch in a lateral direction is smaller than the expansion of a semiconductor chip in the lateral direction. This can mean that in at least one lateral direction the break nucleus or notch do not extend over the entire lateral expansion of the semiconductor chip. In at least one lateral direction, the semiconductor chip therefore has a greater expansion than the break nucleus or notch. It is also possible that the expansion of the break nucleus or notch in a lateral direction is smaller than the expansion of a semiconductor component in the lateral direction. To define the size of the semiconductor components by the break nucleus, it is sufficient if the expansion of the break nucleus or notch in a lateral direction is smaller than the expansion of a semiconductor chip in the lateral direction.

According to at least one embodiment of the method or the semiconductor component, the expansion of the break nucleus or notch in a lateral direction is greater than the expansion of a semiconductor chip in the lateral direction. The break nucleus can extend in a lateral direction over the expansion of more than one semiconductor chip. If a plurality of semiconductor chips is arranged on the carrier, the break nucleus can extend in a lateral direction over the expansion of a plurality of semiconductor chips. This means that in total a lower number of break nuclei is required for singulating the semiconductor components. Furthermore, it is possible that the notch extends over the entire expansion of the semiconductor component in a lateral direction. In the case that the semiconductor chip of the semiconductor component has a smaller expansion in a lateral direction than the component carrier, the expansion of the notch in this lateral direction can be greater than the expansion of the semiconductor chip in this lateral direction. The notch can thus extend evenly along at least one of the side surfaces of the semiconductor component.

According to at least one embodiment of the method or the semiconductor component, in a plane parallel to the main extension plane of the carrier or the component carrier, a main extension direction of the break nucleus or the notch is perpendicular to a crystal direction of the carrier or the component carrier. For example, a plane parallel to the main extension plane of the carrier or component carrier may be the top side of the semiconductor chip or the top side of the carrier or component carrier. The break nucleus or notch may have a main extension direction in a first lateral direction. This first lateral direction can be parallel to the main extension plane of the carrier or component carrier. The carrier may comprise a material that has a crystal structure. For example, the carrier may comprise a semiconductor material. One of the crystal directions of the carrier can be parallel to a second lateral direction. The second lateral direction can be perpendicular to the first lateral direction and parallel to the main extension plane of the carrier. Advantageously, the carrier can thus be broken along a crystal direction of the carrier and along the main extension direction of the break nucleus for singulating a semiconductor component.

According to at least one embodiment of the method or the semiconductor component, prior to breaking the carrier along the at least one break nucleus, the carrier is broken along a crystal direction. The break edge, which results from breaking the carrier along the crystal direction, can be transverse or perpendicular to the main extension plane of the carrier. To singulate the semiconductor components, the carrier can be broken along a crystal direction between two respective semiconductor chips. For singulating a semiconductor component, the carrier as a whole can be singulated along at least two separation planes, the two separation planes being perpendicular to each other. A first separation plane can be given by a crystal direction of the carrier. The first separation plane can be the plane along which the carrier is broken along a crystal direction. The second separation plane can be the plane along which the carrier is broken along the break nucleus.

If a plurality of semiconductor chips is arranged on the carrier, the carrier can be broken in a first step between two respective semiconductor chips along a crystal direction.

The carrier is singulated into sections on which a plurality of semiconductor chips is arranged in one direction. For each of these sections a break nucleus is arranged between two respective semiconductor chips. For complete singulation of the semiconductor components, the carrier can be broken along the break nuclei. In this way, the semiconductor components can be singulated efficiently.

According to at least one embodiment of the method or the semiconductor component, the shape of the break nucleus is asymmetrical. The break nucleus may have a cross-section in a plane parallel to the main extension plane of the carrier. This cross-section may have an asymmetrical shape. This can mean that the cross-section does not have an axis of symmetry. This can also mean that the cross-section along the main extension direction of the break nucleus does not have an axis of symmetry. For example, two opposite side walls of the break nucleus may have different shapes. The shape of the cross-section of the break nucleus can be created by photo technology, for example.

The break nucleus may also have a bottom surface which adjoins the side walls of the break nucleus. The bottom surface may be parallel to the main extension plane of the carrier.

The break nucleus preferably has a main extension direction which is parallel to the main extension plane of the carrier. The semiconductor components can be singulated along the main extension direction of the break nuclei. The break nucleus may have two opposite side walls along its main direction of expansion. By introducing an asymmetry into the cross-section of the break nucleus, it can be predefined along which of the two opposite side walls the carrier is broken during singulation. In case the two opposite side walls have the same shape, the carrier can be broken along one of the respective side walls during singulation. This means that some semiconductor components are singulated along one of the side walls and others of the semiconductor components are singulated along the other side wall. Therefore, the singulated semiconductor components can have different lateral expansions, which can be undesirable. An asymmetry in the cross-section of the break nucleus can lead to the carrier being broken along a preferred side wall. Thus, it is possible to break the carrier for each of the semiconductor components along the preferred side wall. In this case, the singulated semiconductor components have the same lateral expansion.

According to at least one embodiment of the method or the semiconductor component, the break nucleus has the shape of a trench. The trench can be formed in a semiconductor chip and/or the carrier by etching. The trench can be formed from the top side of the semiconductor chips towards the carrier. The trench can extend at least in places through the carrier. By introducing the break nucleus, it is possible to define the position at which the semiconductor components are singulated. In addition, the introduction of the break nucleus simplifies the singulation process.

According to at least one embodiment of the method or semiconductor component, the trench has side walls, at least two opposite side walls having a different shape. The side walls may be transverse or perpendicular to the main extension plane of the carrier. At least two of the side walls may extend along the main extension direction of the trench. These two side walls can be opposite each other. Since the two opposite side walls have different shapes, the break nucleus has an asymmetrical shape. The two opposite side walls can therefore be shaped so that one of the side walls is the preferred side wall for singulating the semiconductor components. Advantageously, the semiconductor components are singulated along the same side wall of the trench. Thus, all semiconductor components can have the same size in the lateral direction.

According to at least one embodiment of the method or the semiconductor component, the expansion of the break nucleus or notch is not constant in the vertical direction. The expansion of the break nucleus in the vertical direction can be the depth of the break nucleus or the trench in the vertical direction. This can mean that not the entire bottom surface of the break nucleus is parallel to the main extension plane of the carrier. It is possible that the bottom surface encloses an angle greater than 0° with the main extension plane of the carrier. It is also possible that the break nucleus has at least two bottom surfaces, wherein the bottom surfaces are arranged at different vertical positions of the break nucleus. This means that the depth of the break nucleus is not constant in the vertical direction.

The notch may have a bottom surface that adjoins a side wall of the notch. The distance from the bottom surface to the top side of the semiconductor chip is not necessarily constant. As described for the break nucleus, the bottom surface of the notch may also run parallel to the main extension plane of the component carrier at least in places or enclose an angle greater than 0° with the main extension plane of the component carrier at least in places. The notch can also have at least two bottom surfaces, which are arranged at different vertical positions of the notch.

If the expansion of the break nucleus or notch is not constant in the vertical direction, a preferred position within the break nucleus can be defined along which the carrier is broken. In this way too it can be achieved that the singulated semiconductor components all have the same expansion in the lateral direction.

According to at least one embodiment of the method or the semiconductor component, a passivation layer is applied on the break nucleus at least in places. The passivation layer can be applied to protect the semiconductor chip. Thus the semiconductor chip can be protected by the passivation layer during singulation. Another possibility is that the passivation layer is applied on the break nucleus only in places. The areas which are not covered by the passivation layer can be chemically roughened, for example by means of KOH. The passivation layer can then be removed again. The break nucleus then has a chemically roughened area and an area which is not chemically roughened. In this way, a preferred position can be defined along which the carrier is broken. For example, the carrier can be broken on the side of the break nucleus which is not chemically roughened. By pre-defining a preferred position along which the carrier is broken, it can be ensured that all singulated semiconductor components have the same size in the lateral direction. For further processing of the semiconductor components it can be advantageous if all semiconductor components have the same size in the lateral direction.

In the following, the method for singulating semiconductor components described here and the semiconductor component described here are explained in more detail in connection with exemplary embodiments and their corresponding figures.

FIGS. 1A and 1B show schematic cross-sections through a semiconductor component according to two exemplary embodiments.

FIGS. 2A, 2B, 2C and 2D describe exemplary embodiments of the method for singulating semiconductor components by means of top views on a carrier with a plurality of semiconductor chips.

Equal or similar elements as well as elements of equal function are designated with the same reference signs in the figures. The figures and the mutual proportions of the elements depicted in the figures are not to be regarded as true to scale. Rather, individual elements may be oversized for better representability and/or comprehensibility.

Figure 1A:
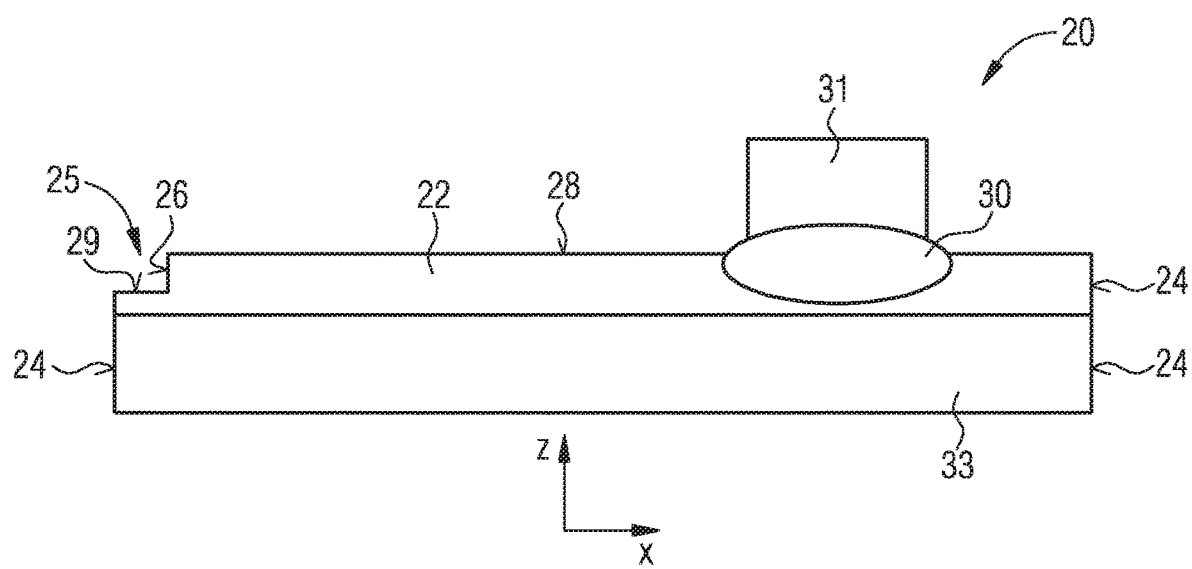

FIG. 1A shows a schematic cross-section through a semiconductor component 20 according to an exemplary embodiment. The semiconductor component 20 comprises a component carrier 33 and a semiconductor chip 22. The semiconductor chip 22 is arranged on the component carrier 33. The semiconductor chip 22 can be a semiconductor laser, for example. In this case the semiconductor chip 22 is a ridge waveguide laser. A laser mode 30 is generated below a strip 31 as shown schematically.

The component carrier 33 has break edges 24 which are perpendicular to the main extension plane of the component carrier 33. The break edges 24 also extend along the semiconductor chip 22. One of the break edges 24 has a notch 25. The notch 25 is arranged next to the strip 31 of the semiconductor laser in a lateral direction x, the lateral direction x being parallel to the main extension plane of the component carrier 33. The notch 25 is a recess or trench in the semiconductor chip 22, which can be formed by an etching process. Therefore the break edge 24 shows traces of an etching process in the area of the notch 25. The notch 25 has a side wall 26 and a bottom surface 29. A lateral expansion of the semiconductor component 20 in the lateral direction x at a top side 28 of the semiconductor component 20 facing away from the component carrier 33 is smaller in the area of the notch 25 than the lateral expansion of the semiconductor component 20 in the lateral direction x in the area of the component carrier 33 near the side of the component carrier 33 facing away from the semiconductor chip 22.

The expansion of the notch 25 in a vertical direction z, which is perpendicular to the main extension plane of the component carrier 33, is at least 1% of the expansion of the component carrier 33 in the vertical direction z. Preferably, the expansion of the notch 25 in the vertical direction z is at least 5% and at most 40% of the expansion of the component carrier 33 in the vertical direction z. In other exemplary embodiments, the notch 25 can also extend in the area of the component carrier 33 and not only in the area of the semiconductor chip 22.

Figure 1B:
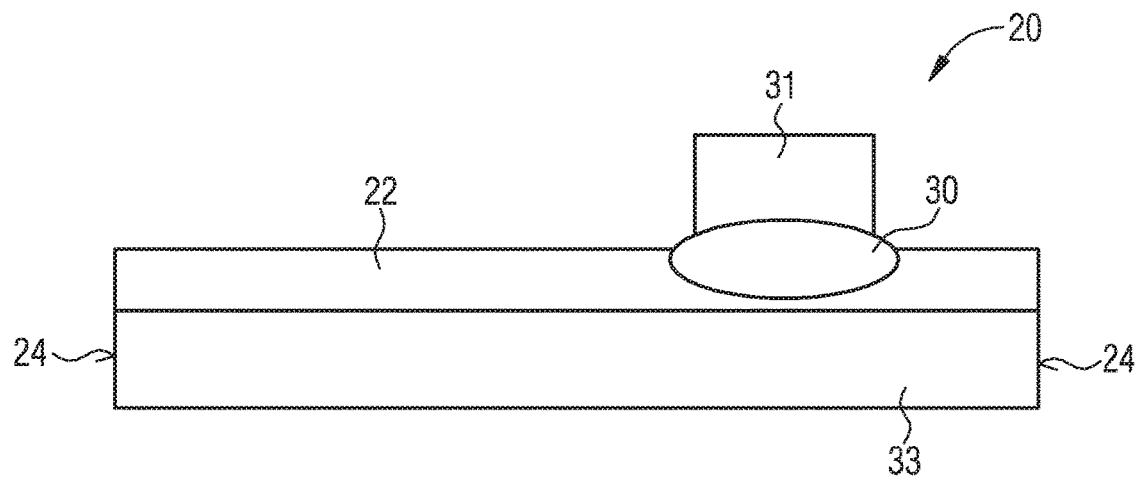

FIG. 1B shows a cross-section through another exemplary embodiment of a semiconductor component 20. In this exemplary embodiment, the notch 25 is arranged on the other side of the strip 31 than shown in FIG. 1A. The notch 25 is not shown in FIG. 1B. Compared to the exemplary embodiment in FIG. 1A, the semiconductor component 20 in FIG. 1B was singulated along the side wall 26 of the notch 25. The semiconductor component 20 shown in FIG. 1A was singulated along a different position within the notch 25 than the semiconductor component 20 shown in FIG. 1B.

Figure 2A:
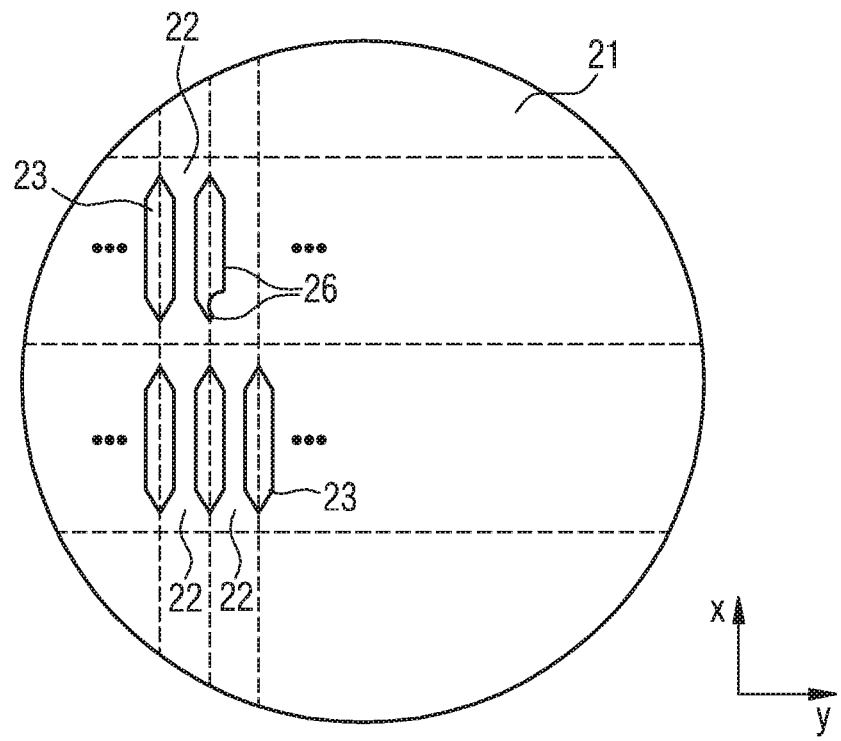

By means of the top view on a carrier 21 with a plurality of semiconductor chips 22 shown in FIG. 2A, an exemplary embodiment of the method for singulating semiconductor components 20 is described. A plurality of semiconductor chips 22 is arranged on the carrier 21 on a top side 28 of the carrier 21. The semiconductor chips 22 are arranged at nodes of a regular grid. At a side of the carrier 21 facing the semiconductor chips 22, break nuclei 23 are etched in each case between two semiconductor chips 22. The break nuclei 23 can be created by plasma etching, for example. The break nuclei 23 are arranged in each case between two semiconductor chips 22 in the lateral direction x and extend in the vertical direction z. The expansion of the break nuclei 23 in the vertical direction z is at least 1% of the expansion of the carrier 21 in the vertical direction z. Preferably, the expansion of the break nuclei 23 in the vertical direction z is at least 5% and at most 40% of the expansion of the carrier 21 in the vertical direction z.

The break nuclei 23 are arranged spaced apart from each other along a straight line in a first lateral direction x. The break nuclei 23 have a main extension direction which is parallel to the first lateral direction x. In this exemplary embodiment the break nuclei 23 also have an axis of symmetry which is parallel to the first lateral direction x. The distance between two respective break nuclei 23 in the first lateral direction x may be at least 10 µm and at most 50 µm. Preferably, the distance between two respective break nuclei 23 in the first lateral direction x is at least 25 µm and at most 30 µm. The expansion of the break nuclei 23 in the first lateral direction x is smaller than the expansion of a semiconductor chip 22 in the first lateral direction x.

In a second lateral direction y, one semiconductor chip 22 is arranged in each case between two break nuclei 23. The second lateral direction y is perpendicular to the first lateral direction x and the vertical direction z. As an example, only five break nuclei 23 are shown in FIG. 2A. On the carrier 21, however, further break nuclei 23 and further semiconductor chips 22 can be arranged in both lateral directions x, y.

The angle between two side walls 26 of a break nucleus 23 as shown in FIG. 2A may be at least 90° and at most 179°. Preferably, the shown angle is greater than 130°. The expansion of each break nucleus 23 in the second lateral direction y may be at least 1 µm and at most 50 µm.

Preferably, the expansion of each break nucleus 23 in the second lateral direction y is at most 10 µm.

The carrier 21 comprises a material with a crystal structure. One of the crystal directions of the carrier 21 is parallel to the second lateral direction y. This means that the main extension direction of the break nucleus 23 is perpendicular to a crystal direction of the carrier 21.

In a next method step, the carrier 21 is broken along a crystal direction. The carrier 21 is broken along the crystal direction which is parallel to the second lateral direction y. The carrier 21 is broken in each case between two semiconductor components 20 along the crystal direction. This creates sections on which a plurality of semiconductor chips 22 are arranged side by side along the second lateral direction y.

In a next method step, the semiconductor components 20 are singulated by breaking the carrier 21 along the break nucleus 23, which is arranged between the respective two semiconductor chips 22 of the semiconductor components 20. Thus, each of the sections is singulated into individual semiconductor components 20 by breaking the carrier 21 along each of the break nuclei 23. Each of the singulated semiconductor components 20 comprises at least one semiconductor chip 22.

Figure 2B:
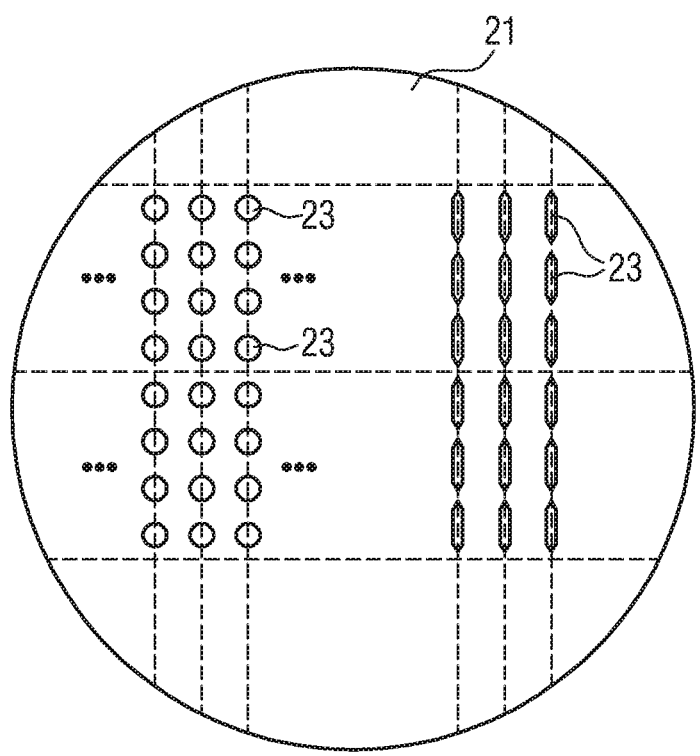

FIG. 2B describes a further exemplary embodiment of the method for singulating semiconductor components 20. The structure in FIG. 2B corresponds to the structure in FIG. 2A. FIG. 2B shows two possibilities for the arrangement of the break nuclei 23 in a top view on the carrier 21 with the semiconductor chips 22. Like in FIG. 2A, the break nuclei 23 are spaced apart from each other. The break nuclei 23 can have a cross-section in the shape of a circle in the top view. Furthermore, it is possible that the break nuclei 23 have a cross-section in the top view as shown in FIG. 2A.

Figure 2C:
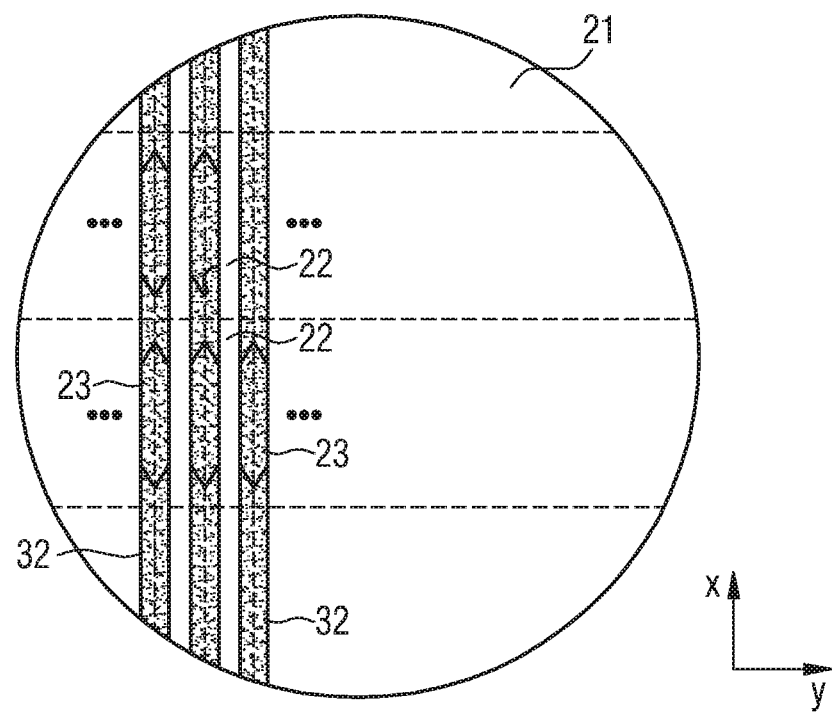

FIG. 2C describes a further exemplary embodiment of the method for singulating semiconductor components 20. The structure in FIG. 2C corresponds to the structure in FIG. 2A. In addition to the break nuclei 23 described in FIG. 2A, further break nuclei 32 are etched. The further break nuclei 32 extend over the entire expansion of the carrier 21 in the first lateral direction x. Thus, the expansion of the further break nuclei 32 in the first lateral direction x is greater than the expansion of a semiconductor chip 22 in the first lateral direction x. The further break nuclei 32 have a smaller expansion in the vertical direction z than the break nuclei 23. The expansion of the further break nuclei 32 in the second lateral direction y is equal to the expansion of the break nuclei 23 in the second lateral direction y. However, it is also possible that the expansion of the further break nuclei 32 in the second lateral direction y is smaller or greater than the expansion of the break nuclei 23 in the second lateral direction y. Furthermore, the break nuclei 23 may have a different shape than shown in FIG. 2C. The further break nuclei 32 can further simplify the singulation of the semiconductor components 20.

Figure 2D:
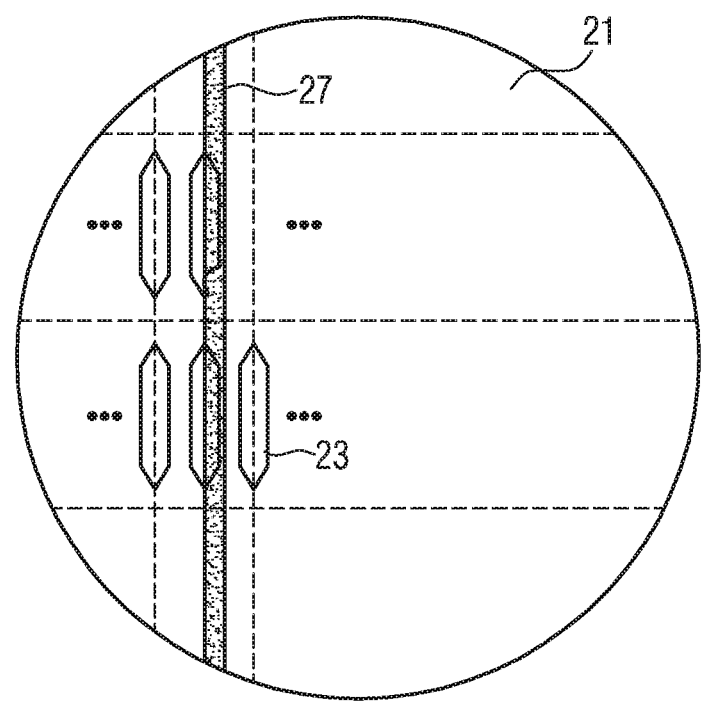

FIG. 2D describes a further exemplary embodiment of the method for singulating semiconductor components 20. The structure in FIG. 2D corresponds to the structure in FIG. 2A. According to this exemplary embodiment, a passivation layer 27, which extends along the first lateral direction x, is applied in places on the break nuclei 23. The areas of the break nuclei 23 which are not covered by the passivation layer 27 are chemically roughened, for example by means of KOH. Afterwards the passivation layer 27 is removed again. The break nuclei 23 now have a chemically roughened area and an area which was covered by the passivation layer 27 and is not roughened. In this way, a preferred position can be defined along which the carrier 21 is broken. Preferably, the carrier 21 is broken on the side of the break nucleus 23 which is not roughened. By predefining a preferred position along which the carrier 21 is broken, it can be ensured that all singulated semiconductor components 20 have the same size in the lateral direction x.

FIGS. 3A, 3B, 3C, 3D, 3E, 3F and 3G show a cross-section from the top view through a symmetrical break nucleus 23 according to various exemplary embodiments. Symmetrical in this case means that the break nuclei 23 have an axis of symmetry which is parallel to the first lateral direction x.

Figure 3A:
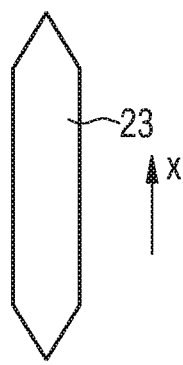
FIGS. 3A, 3B, 3C, 3D, 3E, 3F, 3G, 4A, 4B, 4C, 4D, 4E, 4F, 4G and 4H show a cross-section through a symmetrical break nucleus according to various exemplary embodiments.

In FIG. 3A, the cross-section of the break nucleus 23 has the shape of a rectangle with beveled sides.

Figure 3B:
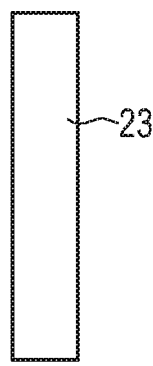

In FIG. 3B the cross-section of the break nucleus 23 has the shape of a rectangle.

Figure 3C:
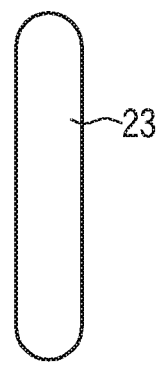

In FIG. 3C, the cross-section of the break nucleus 23 has the shape of a rectangle with rounded sides.

Figure 3D:
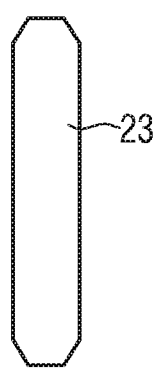

In FIG. 3D, the cross-section of the break nucleus 23 has the shape of a rectangle with rounded corners.

Figure 3E:
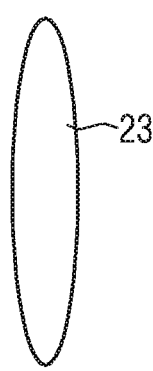

In FIG. 3E, the cross-section of break nucleus 23 has the shape of an ellipse.

Figure 3F:
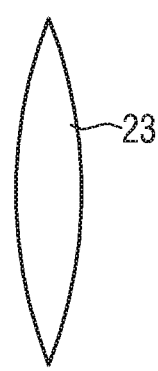

In FIG. 3F the cross-section of the break nucleus 23 is formed by two segments of a circle.

Figure 3G:
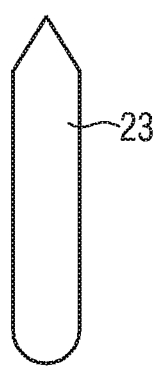
Figure 4A:
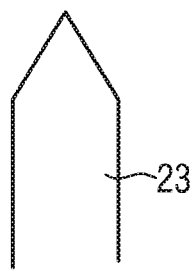
Figure 4B:
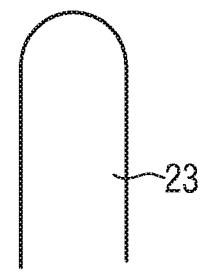
Figure 4C:
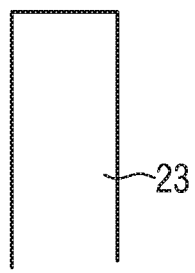
Figure 4D:
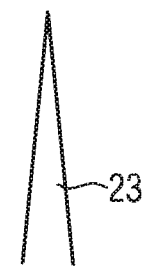
Figure 4E:
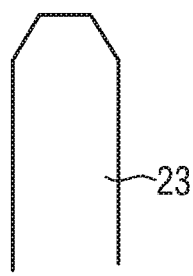
Figure 4F:
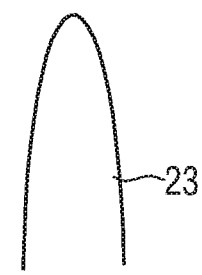
Figure 4G:
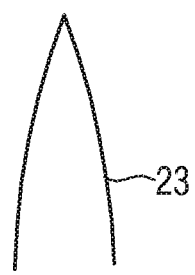
Figure 4H:
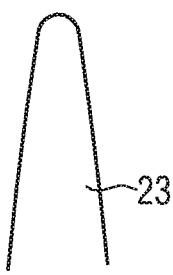

In FIG. 3G, the cross-section of the break nucleus 23 has the shape of a rectangle, one side of the rectangle being beveled and the opposite side of the rectangle being rounded.

FIGS. 4A, 4B, 4C, 4D, 4E, 4F, 4G and 4H show a cross-section from the top view through a part of a symmetrical break nucleus 23 according to various exemplary embodiments. The break nuclei 23 shown thus have similar shapes to those shown with FIGS. 3A, 3B, 3C, 3D, 3E, 3F and 3G.

FIGS. 5A, 5B, 5C, 6A, 6B, 6C and 6D show a cross-section through a break nucleus 23 with an asymmetrical shape according to various exemplary embodiments. Asymmetrical in this case means that the break nuclei 23 have no axis of symmetry along the first lateral direction x.

Figure 5A:
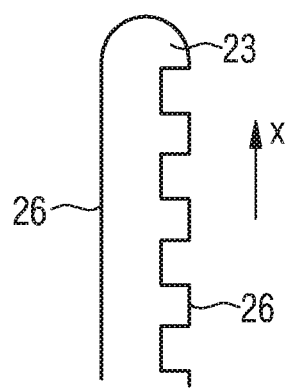
FIGS. 5A, 5B, 5C, 6A, 6B, 6C and 6D show a cross-section through a break nucleus with an asymmetrical shape according to various exemplary embodiments.
Figure 5B:
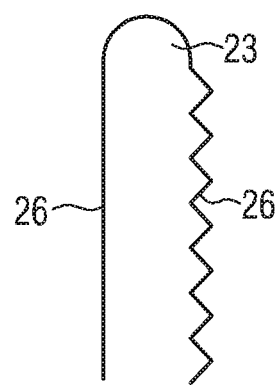
Figure 5C:
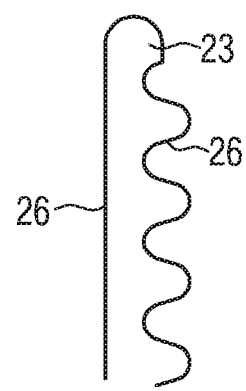
Figure 6A:
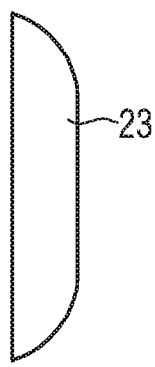
Figure 6B:
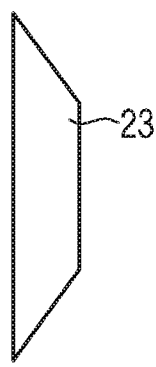
Figure 6C:
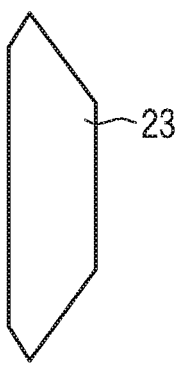
Figure 6D:
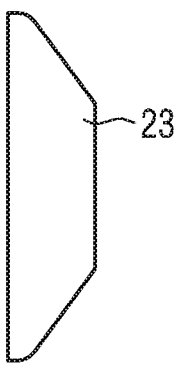

In FIGS. 5A, 5B and 5C, the break nucleus 23 has a rectilinear side wall 26 along the first lateral direction x and an opposite irregular or roughened side wall 26. This can mean that the break nuclei 23 shown have a first side wall 26 that spans a plane perpendicular to the main extension plane of the carrier 21. In addition, the break nuclei 23 shown have a second side wall 26, which is opposite the first side wall 26 and has an irregular structure. The irregular structure of the second side wall 26 can be produced by chemical roughening, for example.

FIGS. 6A, 6B, 6C and 6D show further exemplary embodiments of the break nucleus 23 with an asymmetrical shape.

By introducing an asymmetry in the cross-section of the break nucleus 23, it can be defined along which of the two opposite side walls 26 the carrier 21 is broken during singulation. An asymmetry in the cross-section of the break nucleus 23 can lead to the carrier 21 being broken along a preferred side wall 26. Thus it is possible to break the carrier 21 for each of the semiconductor components 20 along the preferred sidewall 26. In this case the singulated semiconductor components 20 have the same lateral expansion.

FIGS. 7A, 7B, 7C, 7D, 7E and 7F show a cross-section through a break nucleus 23 according to further exemplary embodiments, in which the expansion of the break nucleus 23 in the vertical direction z is not constant. The break nuclei 23 are shown as cross-sections along a plane perpendicular to the main extension plane of the carrier 21. Thus, the extension of the break nuclei 23 in the vertical direction z is shown.

Figure 7A:
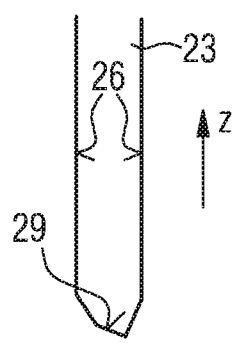
FIGS. 7A, 7B, 7C, 7D, 7E and 7F show a cross-section through a break nucleus according to further exemplary embodiments.

In FIG. 7A, the break nucleus 23 has a bottom surface 29 which is not parallel to the main extension plane of the carrier 21. The side walls 26 of the break nucleus 23 are perpendicular to the main extension plane of the carrier 21.

Figure 7B:
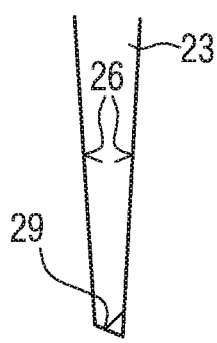

In FIG. 7B, the break nucleus 23 has a bottom surface 29 which is not parallel to the main extension plane of the carrier 21. The side walls 26 enclose an angle with the vertical direction z of greater than 0°.

Figure 7C:
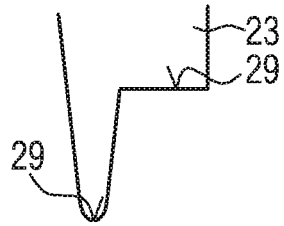

In FIG. 7C, the break nucleus 23 has two bottom surfaces 29, which are located at different vertical positions. Thus, the trench has a greater depth in the area of one of the bottom surfaces 29 than in the area of the other bottom surface 29. Thus, it is possible to define a preferred side along which the carrier 21 is broken to singulate the semiconductor components 20.

Figure 7D:
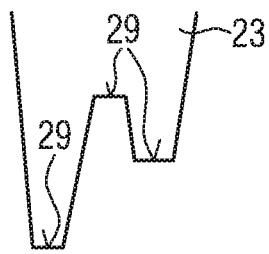
Figure 7E:
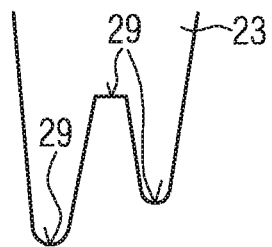

In FIGS. 7D and 7E, the break nucleus 23 has three bottom surfaces 29. Again, the trench has a greater depth in the area of one of the bottom surfaces 29 than in the areas of the other bottom surfaces 29.

Figure 7F:
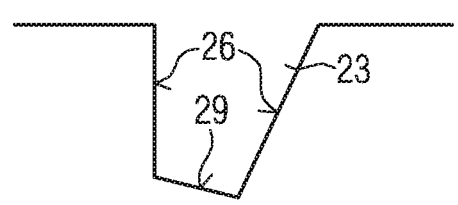

In FIG. 7F, the break nucleus 23 has a bottom surface 29 which is not parallel to the main extension plane of the carrier 21. One of the side walls 26 runs parallel to the vertical direction z and another one of the side walls 26 runs at an angle greater than 0° to the vertical direction z.

The invention is not limited to the exemplary embodiments by the description based on the same. Rather, the invention comprises any new feature as well as any combination of features, which includes in particular any combination of features in the claims, even if this feature or combination itself is not explicitly stated in the claims or exemplary embodiments.

The present patent application claims the priority of German patent application DE 10 2018 100 763.9, the disclosure content of which is hereby included by way of reference.

LIST OF REFERENCE SIGNS

20: semiconductor component
21: carrier
22: semiconductor chip
23: break nucleus
24: break edge
25: notch
26: side wall
27: passivation layer
28: top side
29: bottom surface
30: laser mode
31: strip
32: further break nucleus
33: component carrier
x: lateral direction
z: vertical direction

The invention claimed is:

1. A method for singulating semiconductor components, the method comprising:
   providing a carrier;
   applying at least two semiconductor chips on the carrier;
   etching at least one break nucleus at a side of the carrier facing the semiconductor chips;
   applying a passivation layer only on at least one portion of at least one break nucleus and not on an other portion of the break nucleus; and
   singulating at least two semiconductor components by breaking the carrier along the at least one break nucleus, wherein
   the at least one break nucleus extends at least in places in a vertical direction (z), the vertical direction (z) being perpendicular to a main extension plane of the carrier,
   the at least one break nucleus is arranged between the two semiconductor chips in a lateral direction (x), the lateral direction (x) being parallel to the main extension plane of the carrier,
   each of the semiconductor components comprises at least one of the semiconductor chips, and
   the expansion of the at least one break nucleus in the vertical direction (z) is at least 1% of the expansion of the carrier in the vertical direction (z).

2. The method according to claim 1, wherein:
   break edges are produced by the singulating, and
   at least one of the break edges has a notch at least in places,
   the break edge shows traces of the etching in the area of the notch.

3. The method according to claim 2, wherein the expansion of the at least one break nucleus or notch in the vertical direction (z) is at least 5% and at most 40% of the expansion of the carrier in the vertical direction (z).

4. The method according to claim 2, wherein the expansion of the break nucleus or notch in a lateral direction (x) is smaller than the expansion of one of the at least two semiconductor chips in the lateral direction (x).

5. The method according to claim 2, wherein the expansion of the break nucleus or notch in a lateral direction (x)

is greater than the expansion of one of the at least two semiconductor chips in the lateral direction (x).

6. The method according to claim 2, wherein in a plane parallel to the main extension plane of the carrier, a main extension direction of the break nucleus or the notch is perpendicular to a crystal direction of the carrier.

7. The method according to claim 2, wherein the expansion of the break nucleus or notch is not constant in the vertical direction (z).

8. The method according to claim 2, wherein a passivation layer is applied at least in places on the break nucleus.

9. The method according to claim 1, wherein the break nucleus is generated by plasma etching.

10. The method according to claim 1, wherein the semiconductor components are semiconductor lasers.

11. The method according to claim 1, wherein prior to breaking the carrier along the at least one break nucleus, the carrier is broken along a crystal direction.

12. The method according to claim 1, wherein a shape of the break nucleus is asymmetrical or wherein the break nucleus has a shape of a trench having two opposite side walls of different shapes.

13. The method of claim 1, wherein the areas of the break nucleus which are not covered by the passivation layer are roughened.

14. A semiconductor component comprising:
a component carrier; and
a semiconductor chip which is arranged on the component carrier, wherein
the component carrier has break edges which extend transversely to a main extension plane of the component carrier,
at least one of the break edges has a notch at least in places, so that a lateral expansion of the semiconductor component in a lateral direction (x) on a top side of the semiconductor component facing away from the component carrier is smaller at least in places than a lateral expansion of the semiconductor component in the lateral direction (x) in the area of the component carrier, the lateral direction (x) being parallel to the main extension plane of the component carrier,
the break edge shows only in places traces of an etching process in an area of the notch, and
the expansion of the notch in the vertical direction (z) is at least 1% of the expansion of the component carrier in the vertical direction (z), the vertical direction (z) being perpendicular to the main extension plane of the component carrier, wherein the notch comprises in some areas that have a higher surface roughness than other areas as a result of a chemically roughing process.

15. The semiconductor component according to claim 14, wherein the expansion of the at least one notch in the vertical direction (z) is at least 5% and at most 40% of the expansion of the component carrier in the vertical direction (z).

16. The semiconductor component according to claim 14, wherein the semiconductor components are semiconductor lasers.

17. The semiconductor component according to claim 14, wherein the expansion of the notch in a lateral direction (x) is smaller than the expansion of a semiconductor chip in the lateral direction (x).

18. The semiconductor component according to claim 14, wherein the expansion of the notch in a lateral direction (x) is greater than the expansion of a semiconductor chip in the lateral direction (x).

19. A method for singulating semiconductor components, comprising:
providing a carrier;
applying at least two semiconductor chips on the carrier;
etching at least one break nucleus at a side of the carrier facing the semiconductor chips;
applying a passivation layer only on at least one portion of at least one break nucleus and not on an other portion of the break nucleus; and
singulating at least two semiconductor components by breaking the carrier along the at least one break nucleus, wherein
the at least one break nucleus extends at least in places in a vertical direction (z), the vertical direction (z) being perpendicular to a main extension plane of the carrier,
the at least one break nucleus is arranged between the two semiconductor chips in a lateral direction (x), the lateral direction (x) being parallel to the main extension plane of the carrier,
each of the semiconductor components comprises at least one of the semiconductor chips, and
the expansion of the at least one break nucleus in the vertical direction (z) is at least 1% of the expansion of the carrier in the vertical direction (z), and
the break nucleus has at least two bottom surfaces which are located in different vertical positions.

20. The method of claim 19, wherein the bottom surfaces of the break nucleus are parallel to the main extension plane of the carrier.

* * * * *

UNITED STATES PATENT AND TRADEMARK OFFICE
CERTIFICATE OF CORRECTION

| | | |
|---|---|---|
| PATENT NO. | : 11,837,844 B2 | Page 1 of 1 |
| APPLICATION NO. | : 16/961901 | |
| DATED | : December 5, 2023 | |
| INVENTOR(S) | : John Brückner et al. | |

It is certified that error appears in the above-identified patent and that said Letters Patent is hereby corrected as shown below:

In the Claims

Column 16, Line 1, Claim 14, "comprises in some" should be -- comprises some --

Signed and Sealed this
Twentieth Day of February, 2024

*Katherine Kelly Vidal*

Katherine Kelly Vidal
*Director of the United States Patent and Trademark Office*